(12) United States Patent
Song

(10) Patent No.: US 12,205,662 B2
(45) Date of Patent: Jan. 21, 2025

(54) CONTROLLER, MEMORY SYSTEM AND OPERATING METHOD OF MEMORY SYSTEM

(71) Applicant: SK hynix Inc., Gyeonggi-do (KR)

(72) Inventor: Young Ook Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/471,307

(22) Filed: Sep. 21, 2023

(65) Prior Publication Data

US 2024/0363189 A1     Oct. 31, 2024

(30) Foreign Application Priority Data

Apr. 27, 2023   (KR) .................. 10-2023-0055238

(51) Int. Cl.
| | |
|---|---|
| *G11C 29/52* | (2006.01) |
| *G11C 7/10* | (2006.01) |
| *G11C 7/20* | (2006.01) |
| *G11C 7/22* | (2006.01) |

(52) U.S. Cl.
CPC ............ *G11C 29/52* (2013.01); *G11C 7/1069* (2013.01); *G11C 7/20* (2013.01); *G11C 7/222* (2013.01)

(58) Field of Classification Search
None
See application file for complete search history.

(56) References Cited

U.S. PATENT DOCUMENTS

| | | | | |
|---|---|---|---|---|
| 11,081,193 B1* | 8/2021 | Tang | ..................... | G11C 16/32 |
| 2006/0047450 A1* | 3/2006 | Tabatabaei | ....... | G01R 31/31709 |
| | | | | 702/69 |
| 2017/0351569 A1* | 12/2017 | Teitel | ..................... | G11C 16/26 |
| 2018/0018583 A1* | 1/2018 | Cha | ........................ | G06N 20/00 |
| 2019/0189226 A1 | 6/2019 | Srivastava et al. | | |
| 2019/0303239 A1* | 10/2019 | Hsiao | .................. | G06F 12/0246 |
| 2020/0342923 A1* | 10/2020 | Lee | .................. | G11C 29/12015 |
| 2021/0202028 A1* | 7/2021 | Choi | ................... | G11C 29/4401 |
| 2021/0318968 A1* | 10/2021 | Mayer | ................. | G06F 13/1668 |
| 2021/0343325 A1* | 11/2021 | Moon | ................. | G11C 11/4076 |
| 2022/0051733 A1* | 2/2022 | Park | ........................ | G11C 16/32 |
| 2024/0012443 A1* | 1/2024 | Lee | ....................... | G11C 29/028 |
| 2024/0047003 A1* | 2/2024 | Lee | .................. | G11C 29/50008 |
| 2024/0211344 A1* | 6/2024 | Bains | ................... | G11C 29/028 |
| 2024/0212729 A1* | 6/2024 | Kim | ...................... | G11C 29/023 |

FOREIGN PATENT DOCUMENTS

KR     10-2023-0021409 A      2/2023

OTHER PUBLICATIONS

Y. Fang, A. Jaiswal and K. Hofmann, "Low-power signal integrity trainings for multi-clock source-synchronous memory systems," 2013 IEEE International SOC Conference, Erlangen, Germany, 2013, pp. 319-324, (Year: 2013).*

* cited by examiner

*Primary Examiner* — Daniel F. McMahon
(74) *Attorney, Agent, or Firm* — IP & T GROUP LLP

(57) ABSTRACT

A memory system includes a plurality of memory devices; and a memory controller configured to perform an initial training operation to set a plurality of time codes corresponding to the plurality of memory devices, respectively, receive a plurality of data signals read from the plurality of memory devices, as internal data signals, according to the plurality of time codes, respectively, and adjust the plurality of time codes based on the internal data signals and error pattern maps generated by collecting error location information for the internal data signals.

23 Claims, 13 Drawing Sheets

FIG. 6A

| BL | DIN1 |
|---|---|
| 0 | A |
| 1 | B |
| 2 | C |
| 3 | D |
| 4 | E |
| 5 | F |
| 6 | G |
| 7 | H |

TARGET MAP
(T_CODE1 = "3")

FIG. 6B

| BL | DIN1 |
|---|---|
| 0 | XX |
| 1 | XX |
| 2 | A |
| 3 | B |
| 4 | C |
| 5 | D |
| 6 | E |
| 7 | F |

ERROR PATTERN MAP
(T_CODE1 = "1")

FIG. 6C

| BL | DIN1 |
|---|---|
| 0 | XX |
| 1 | A |
| 2 | B |
| 3 | C |
| 4 | D |
| 5 | E |
| 6 | F |
| 7 | G |

ERROR PATTERN MAP
(T_CODE1 = "2")

FIG. 6D

| BL | DIN1 |
|---|---|
| 0 | B |
| 1 | C |
| 2 | D |
| 3 | E |
| 4 | F |
| 5 | G |
| 6 | H |
| 7 | XX |

ERROR PATTERN MAP
(T_CODE1 = "4")

FIG. 6E

| BL | DIN1 |
|----|------|
| 0  | C    |
| 1  | D    |
| 2  | E    |
| 3  | F    |
| 4  | G    |
| 5  | H    |
| 6  | XX   |
| 7  | XX   |

ERROR PATTERN MAP
(T_CODE1 = "5")

CONTROLLER, MEMORY SYSTEM AND OPERATING METHOD OF MEMORY SYSTEM

CROSS-REFERENCE TO RELATED APPLICATION

The present application claims the benefit of Korean Patent Application No. 10-2023-0055238, filed on Apr. 27, 2023, which is incorporated herein by reference in its entirety.

BACKGROUND

1. Field

Various embodiments of the present invention relate to a semiconductor design technology, and more particularly, to a memory system for performing a training operation between a memory controller and a memory device.

2. Description of the Related Art

In general, a semiconductor device may receive data or transmit data in synchronization with a clock. The semiconductor device may transmit and receive data using a data strobe signal having the same period as the clock. For example, among semiconductor devices, a memory device may receive data transmitted from a memory controller in response to a data strobe signal during a write operation, and output data to the memory controller in synchronization with the data strobe signal during a read operation. Therefore, in order to improve an operation reliability of the semiconductor device, it is important to adjust timings between the clock, the data strobe signal, and the data.

As an operating speed of a semiconductor device increases, a skew of the timings between the clock, the data strobe signal, and the data increases depending on various environments. To address this concern, the semiconductor device may measure a data latch margin by performing a write training or read training operation, and set delay values of circuits that input and output the data or the data strobe signal according to a measurement result, to thereby minimize/remove the skew.

Moreover, even if the delay values are set to optimal values by an initial training operation, a data input/output timing is changed according to the set delay value over time due to various factors such as temperature and voltage. As a result, the training operation should be performed again, leading to a significant performance degradation.

SUMMARY

Embodiments of the present invention are directed to a memory system including a memory controller capable of performing a training operation in real time according to error location information for data signals transmitted from memory devices during a read operation.

According to an embodiment of the present invention, a memory system includes a plurality of memory devices; and a memory controller configured to perform an initial training operation to set a plurality of time codes corresponding to the plurality of memory devices, respectively, receive a plurality of data signals read from the plurality of memory devices, as internal data signals, according to the plurality of time codes, respectively, and adjust the plurality of time codes based on the internal data signals and error pattern maps generated by collecting error location information for the internal data signals.

According to an embodiment of the present invention, a controller includes an error correction module configured to generate error location information by verifying error locations of internal data signals; a training control module configured to generate a plurality of error pattern maps by collecting the error location information for the internal data signals, and adjust a plurality of time codes based on the internal data signals and the error pattern maps; and a memory interface configured to receive data signals from a plurality of memory devices, as the internal data signals, according to delay values set by the plurality of time codes.

According to an embodiment of the present invention, an operating method of a memory system includes performing an initial training operation to set a plurality of time codes corresponding to the plurality of memory devices, respectively; receiving a plurality of data signals read from the plurality of memory devices, as internal data signals, according to the plurality of time codes, respectively, during a read operation; calculating a similarity by comparing error location information corresponding to each of the internal data signals with error pattern maps; and adjusting the plurality of time codes according to the calculated similarity.

Further, according to embodiments of the present invention, the memory system may perform the training operation in real time during the read operation, so that the data input/output timing may be optimized without performance degradation even if the data input/output timing is changed after the initial training operation.

BRIEF DESCRIPTION OF THE DRAWINGS

FIGS. 6A to 6E are tables illustrating examples of error pattern maps according to an embodiment of the present invention.

DETAILED DESCRIPTION

Figure 1:
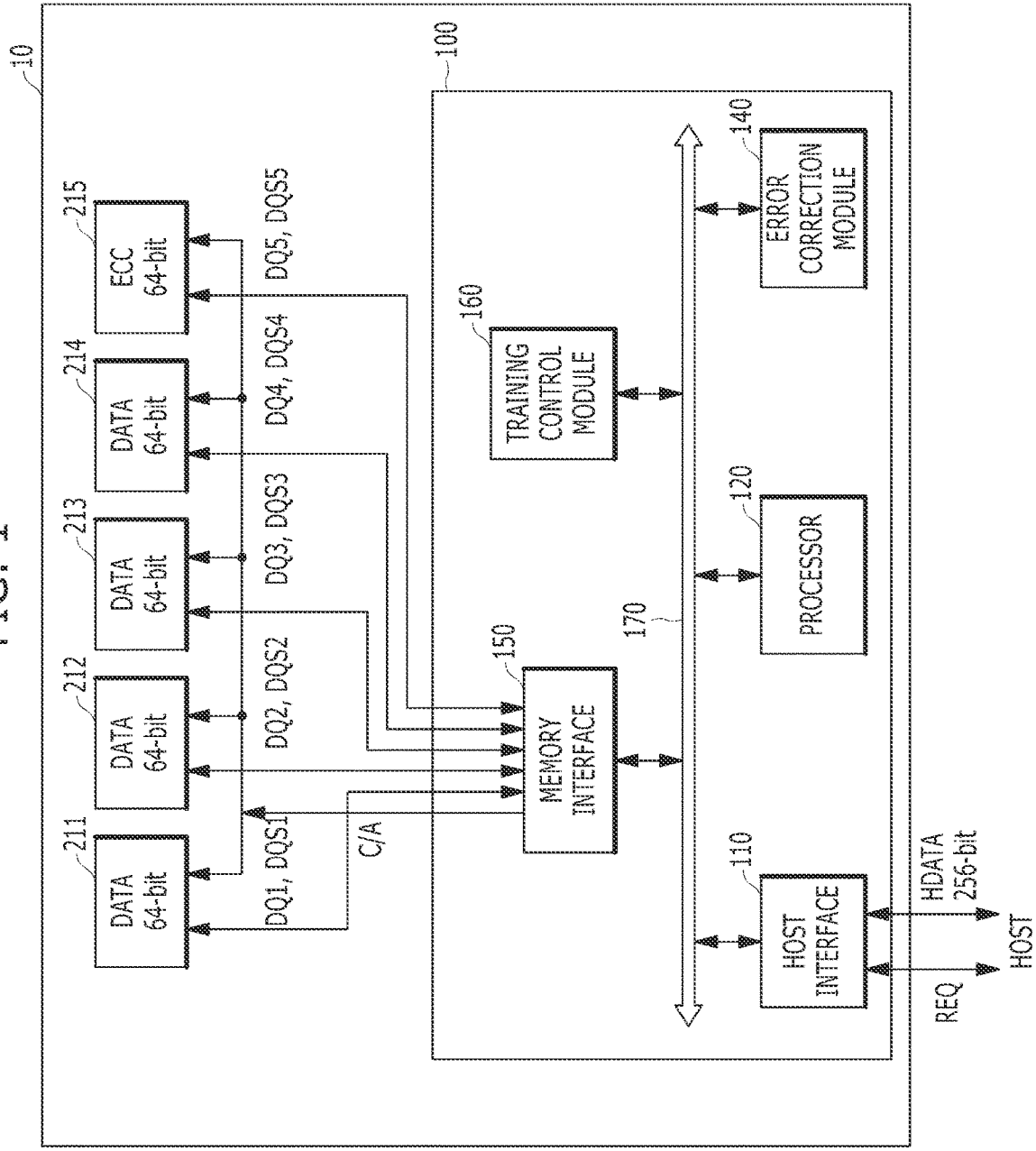
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating a memory system 10 in accordance with an embodiment of the present invention.

Referring to FIG. 1, the memory system 10 may store data or read the stored data in response to a request REQ provided from a host (i.e., an external device). The memory system 10 may be used as a main storage device or an auxiliary storage device of the host. The memory system 10 may be used as a device to store data under the control of the host, such as a mobile phone, a smartphone, an MP3 player, a laptop computer, a desktop computer, a game console, TV, a tablet PC, or an in-vehicle infotainment system.

The host may include one or more independent and substantial processors, each of which may be referred to as a core. The host may be implemented with a single core processor or a multi-core processor including two or more cores. The host may communicate with the memory system 10 using at least one of various communication standards or interfaces such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe of PCI-e), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory system may include a memory controller 100 and a plurality of memory devices 211 to 215. In an embodiment, the memory controller 100 and the memory devices 211 to 215 may constitute a memory module. The memory module may include any one selected from a dual-inline memory module (DIMM), a registered DIMM (RDIMM), a load reduced DIMM (LRDIMM), a non-volatile DIMM (NVDIMM).

The memory controller 100 may control an overall operation of the memory system 10 and control a data exchange between the host and the memory devices 211 to 215. The memory controller 100 may generate a command/address signal C/A and provide it to the memory devices 211 to 215 according to the request REQ from the host. In an embodiment, the memory controller 100 may provide a clock to the memory devices 211 to 215 together with the command/address signal C/A. The memory controller 100 may provide data signals DQ1 to DQ5 and data strobe signals DQS1 to DQS5 corresponding to host data HDATA provided from the host to the memory devices 211 to 215, during a write operation. The memory controller 100 may receive data signals DQ1 to DQ5 and data strobe signals DQS1 to DQS5 read from the memory devices 211 to 215 to the host as host data HDATA, during a read operation.

The memory devices 211 to 215 may perform an active operation, a precharge operation, a refresh operation, a write operation, a read operation, an error check operation, an error correction operation, and an error logging operation, according to the command/address signal C/A and/or the data signals DQ1 to DQ5 and data strobe signals DQS1 to DQS5, which are provided from the memory controller 100. Hereinafter, for convenience of description, a case where first to fifth memory devices 211 to 215 are arranged and the fifth memory device 215 stores an error correction code ECC will be described as an example.

In detail, the memory controller 100 may include a host interface 110, a processor 120, an error correction module 140, a memory interface 150, a training control module 160, and a bus 170.

The host interface 110 may communicate with the host coupled to the memory system 10 under the control of the processor 120. For example, the host interface 110 may receive the request REQ and the host data HDATA from the host, and provide the host data HDATA to the host by receiving the first to fifth data signals DQ1 to DQ5 respectively read from the first to fifth memory devices 211 to 215 through the memory interface 150.

The processor 120 may perform various types of computational and/or other operations for controlling the first to fifth memory devices 211 to 215, and/or may execute instructions in the form of firmware or other types of software. The processor 120 may receive the request REQ and the host data HDATA provided from the host through the host interface 110. The processor 120 may generate various commands (e.g., an active command, a precharge command, a refresh command, a refresh management command, a read command, a write command, a mode register command, an error check command, and an error information request command) corresponding to the request REQ, and addresses (e.g., a bank address, a row address, and a column address). The processor 120 may change an order of the operation to be instructed to the first to fifth memory devices 211 to 215 to be different from an order in which the request REQ is received from the host, in order to improve the performance of the first to fifth memory devices 211 to 215. For example, the processor 120 may adjust the order so that a write operation is performed before a read operation, even if the host requests the read operation of the first to fifth memory devices 211 to 215 first and the write operation later. The processor 120 may control operations of the host interface 110, the error correction module 140, the memory interface 150, and the training control module 160.

The error correction module 140 may generate an error correction code ECC using the host data HDATA during a write operation. In the embodiment of FIG. 1, the unit of the host data HDATA processed during one write operation or one read operation, that is, a chunk size, is 256-bit, and the number of bits of the error correction code ECC is 64-bit. During the write operation, only the error correction code ECC is generated, but the error correction operation is not performed, so the 256-bit host data HDATA may be respectively transmitted to the first to fourth memory devices 211 to 214 as the data signals DQ1 to DQ4, each for 64-bit, and the 64-bit error correction code ECC may be transmitted to the fifth memory device 215.

In addition, the error correction module 140 may correct errors in the data signals DQ1 to DQ4 transmitted from the first to fourth memory devices 211 to 214 using the error correction code ECC corresponding to the data signal DQ5, respectively transmitted from the fifth memory device 215, during the read operation. In an embodiment, errors in the data signals DQ1 to DQ4 transmitted from the first to fourth memory devices 211 to 214 as well as the data signal DQ5 transmitted from the fifth memory device 215 may be corrected. The error-corrected data signal may be transferred to the host as the 256-bit host data HDATA. In an embodiment, the error correction module 140 may generate error location information (ERR_P in FIG. 2) by verifying error locations of the first to fifth data signals DQ1 to DQ5 respectively transmitted from the first to fifth memory devices 211 to 215 during the read operation. A detailed configuration of the error correction module 140 will be described in FIG. 3.

The memory interface 150 may communicate with the first to fifth memory devices 211 to 215 under the control of the processor 120. For example, the memory interface 150 may respectively transmit the command/address signal C/A, the first to fifth data signals DQ1 to DQ5 and the first to fifth data strobe signals DQS1 to DQS5 to the first to fifth memory devices 211 to 215, during a write operation. The memory interface 150 may respectively receive the first to fifth data signals DQ1 to DQ5 read from the first to fifth memory devices 211 to 215 according to the first to fifth data strobe signals DQS1 to DQS5, during a read operation. In an embodiment, the memory interface 150 may respectively receive the first to fifth data signals DQ1 to DQ5 according to delay values set by first to fifth time codes (T_CODE1 to T_CODE5 shown in FIG. 2) provided from the training control module 160 during a read operation. A detailed configuration and operation of the memory interface 150 will be described with reference to FIGS. 4 and 5.

The training control module 160 may set the first to fifth time codes T_CODE1 to T_CODE5 by performing an initial training operation during boot-up. In addition, the training control module 160 may generate a plurality of error pattern maps by collecting the error location information ERR_P for the first to fifth data signals DQ1 to DQ5 provided from the error correction module 140. In this case, the training control module 160 may generate a plurality of error pattern maps for each time code by collecting the error location information ERR_P for each of the first to fifth data signals DQ1 to DQ5. The training control module 160 may adjust the first to fifth time codes T_CODE1 to T_CODE5, respectively, based on the error pattern maps and the first to fifth data signals DQ1 to DQ5 during a read operation. Each of the first to fifth time codes T_CODE1 to T_CODE5 may be a signal including multi-bits. A detailed configuration and operation of the training control module 160 will be described in FIG. 2.

The processor 120 may transmit data between the host interface 110, the error correction module 140, the memory interface 150 and the training control module 160 via the bus 170. In an embodiment, the host interface 110, the error correction module 140, the memory interface 150 and the training control module 160 may communicate with each other independently without passing through the bus 170. For example, the training control module 160 and the host interface 110 may communicate directly with each other without passing through the bus 170. The training control module 160 and the memory interface 150 may communicate with each other directly without passing through the bus 170. The host interface 110 and the memory interface 150 may also communicate directly with each other without passing through the bus 170.

As described above, in accordance with an embodiment of the present invention, in the memory system 10, the time codes may be adjusted based on the error location information for the data signals transmitted from the memory devices during the read operation, and the data signals may be latched according to the time codes. That is, the time codes may be adjusted in real time during the read operation without entering a separate training mode. Accordingly, by performing the training operation in real time during the read operation, the data input/output timing may be optimized without performance degradation even if the data input/output timing is changed due to various factors after the initial training operation.

Hereinafter, a detailed configuration of the memory system 10 in accordance with an embodiment will be described.

Figure 2:
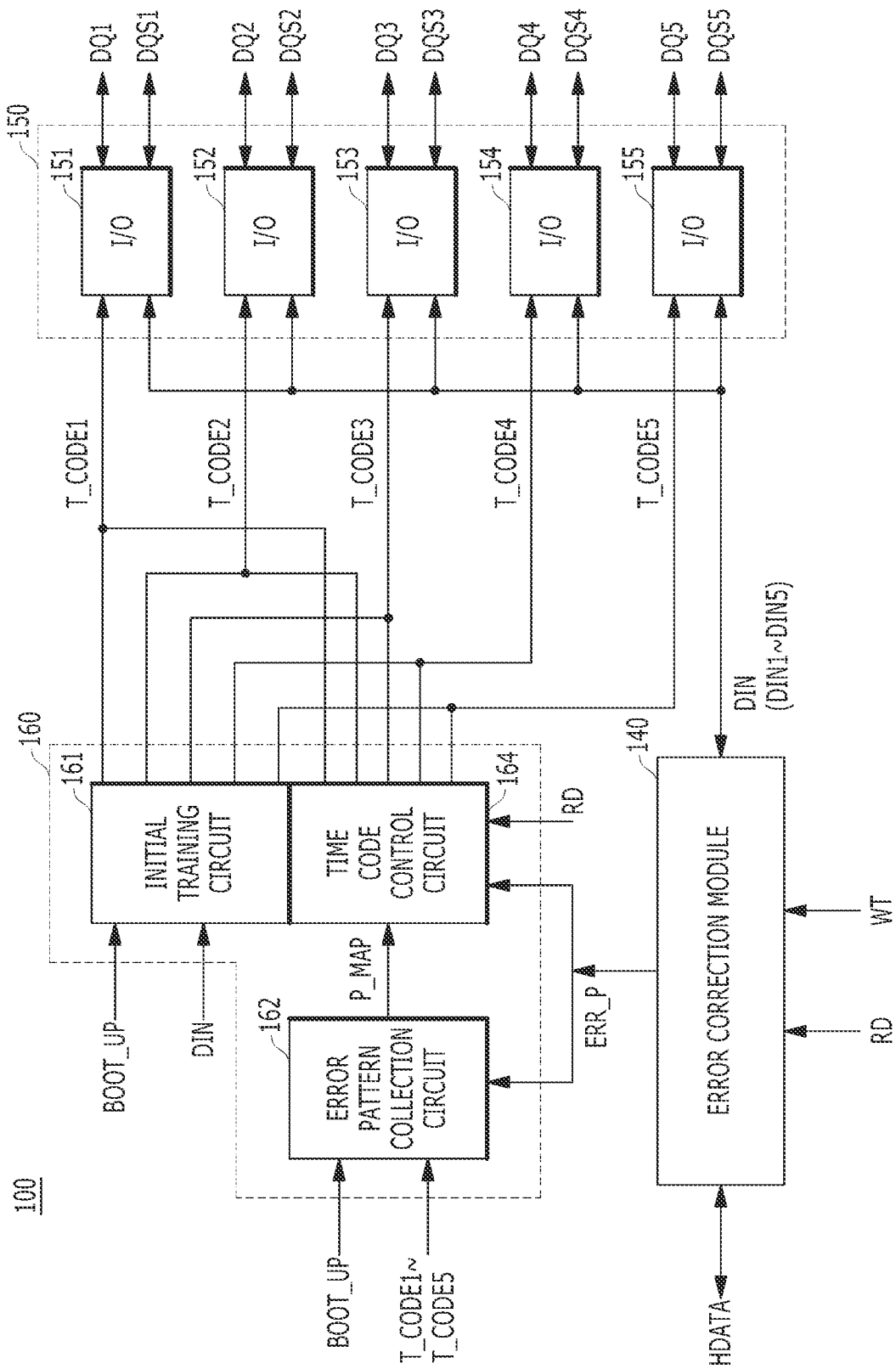
FIG. 2 is a configuration diagram illustrating a memory controller in accordance with an embodiment of the present invention.

FIG. 2 is a configuration diagram illustrating the memory controller 100 in accordance with an embodiment of the present invention.

In FIG. 2, a detailed configuration of the error correction module 140, the memory interface 150 and the training control module 160 is shown.

The memory interface 150 may include first to fifth data input/output (I/O) circuits 151 to 155 respectively corresponding to the first to fifth memory devices 211 to 215. The first to fifth data I/O circuits 151 to 155 may transmit and receive the first to fifth data signals DQ1 to DQ5 and the first to fifth data strobe signals DQS1 to DQS5, respectively, to and from the first to fifth memory devices 211 to 215, during a write operation and a read operation. During the write operation, the first to fifth data I/O circuits 151 to 155 may transmit the first to fifth data signals DQ1 to DQ5 corresponding to internal data DIN to the first to fifth memory devices 211 to 215 in synchronization with the first to fifth data strobe signals DQS1 to DQS5. During the read operation, the first to fifth data I/O circuits 151 to 155 may receive the first to fifth data signals DQ1 to DQ5 transmitted from the first to fifth memory devices 211 to 215 as the internal data DIN in synchronization with the first to fifth data strobe signals DQS1 to DQS5, according to a delay value set by the first to fifth time codes T_CODE1 to T_CODE5.

While FIG. 2 illustrates that the memory interface 150 includes only the first to fifth data I/O circuits 151 to 155, the memory interface 150 may further include a transmit circuit for transmitting the command/address signal C/A to the first to fifth memory devices 211 to 215.

For reference, each memory device may transmit and receive serial data of a preset length through a plurality of data pads/pins in a write operation and a read operation. The preset length may be set by a burst length (BL) defined in the specification. The number of the data pads/pins and the burst length (BL) may determine a size of a data signal. In the following embodiment, a case where 8 data pads/pins of each memory device are arranged, and 8-bit data are transmitted and received in series (i.e., BL=8) through each data pad/pin at each write operation and read operation is described as an example. Each of the first to fifth data I/O circuits 151 to 155 may transmit and receive the 64-bit data signal at a time to and from the corresponding memory device.

The error correction module 140 may, in response to a write command WT, generate the 64-bit error correction code ECC using the 256-bit host data HDATA received from the host interface 110, and output the 256-bit host data HDATA and the 64-bit error correction code ECC as the internal data DIN of 320-bit. The internal data DIN may include first to fourth internal data signal DIN1 to DIN4 corresponding to the host data HDATA and a fifth internal data signal DIN5 corresponding to the error correction code ECC. The error correction module 140 may, in response to a read command RD, correct errors in the first to fifth internal data signals DIN1 to DIN5 using the fifth internal data signal DIN5 of the 320-bit internal data DIN to output the error-corrected data signal to the host interface 110 as the 256-bit host data HDATA. In addition, the error correction module 140 may, in response to the read command RD, verify error locations of the first to fifth internal data signals DIN1 to DIN5, generate the error location information ERR_P, and transmit the error location information ERR_P and the internal data DIN to the training control module 160.

The training control module 160 may include an initial training circuit 161, an error pattern collection circuit 162, and a time code control circuit 164.

The initial training circuit 161 may perform an initial training operation during boot-up to set the first to fifth time codes T_CODE1 to T_CODE5. The initial training operation may be performed in the same manner as known training operations. For example, the initial training circuit 161 may enter a training mode in response to a boot-up signal BOOT_UP (or a training mode signal) and set the first to fifth time codes T_CODE1 to T_CODE5 by comparing the first to fifth internal data signals DIN1 to DIN5 with target data. In order to perform the actual training operation, the initial training circuit 161 may receive additional control signals, but this will be omitted in order to focus on the essence of the invention.

The error pattern collection circuit 162 may generate the error pattern maps by collecting the error location information ERR_P provided from the error correction module 140. The error pattern collection circuit 162 may generate the error pattern maps for each of the first to fifth time codes T_CODE1 to T_CODE5 set by the initial training circuit 161 during boot-up. The error pattern collection circuit 162 may generate the error pattern maps by mapping the error location information ERR_P to each of the set time codes. The error pattern collection circuit 162 may provide map information P_MAP including the error pattern maps of each time code to the time code control circuit 164. The error pattern maps collected by the error pattern collection circuit 162 will be described with reference to FIGS. 6A to 6E.

The time code control circuit 164 may compare the error location information ERR_P corresponding to each of the first to fifth internal data signals DIN1 to DIN5 with the error pattern maps of each time code, included in the map information P_MAP, to thereby calculate a similarity therebetween, in response to the read command RD. The time code control circuit 164 may adjust the first to fifth time codes T_CODE1 to T_CODE5 according to the calculated similarity. For example, the time code control circuit 164 may adjust the first time code T_CODE1 by comparing the error pattern maps for the first time code T_CODE1 with the error location information ERR_P for the first internal data signal DIN1, adjust the second time code T_CODE2 by comparing the error pattern maps for the second time code T_CODE2 with the error location information ERR_P for the second internal data signal DIN2, adjust the third time code T_CODE3 by comparing the error pattern maps for the third time code T_CODE3 with the error location information ERR_P for the third internal data signal DIN3, adjust the fourth time code T_CODE4 by comparing the error pattern maps for the fourth time code T_CODE4 with the error location information ERR_P for the fourth internal data signal DIN2, and adjust the fifth time code T_CODE5 by comparing the error pattern maps for the fifth time code T_CODE5 with the error location information ERR_P for the fifth internal data signal DIN5. A detailed configuration of the time code control circuit 164 will be described with reference to FIG. 7.

Figure 3:
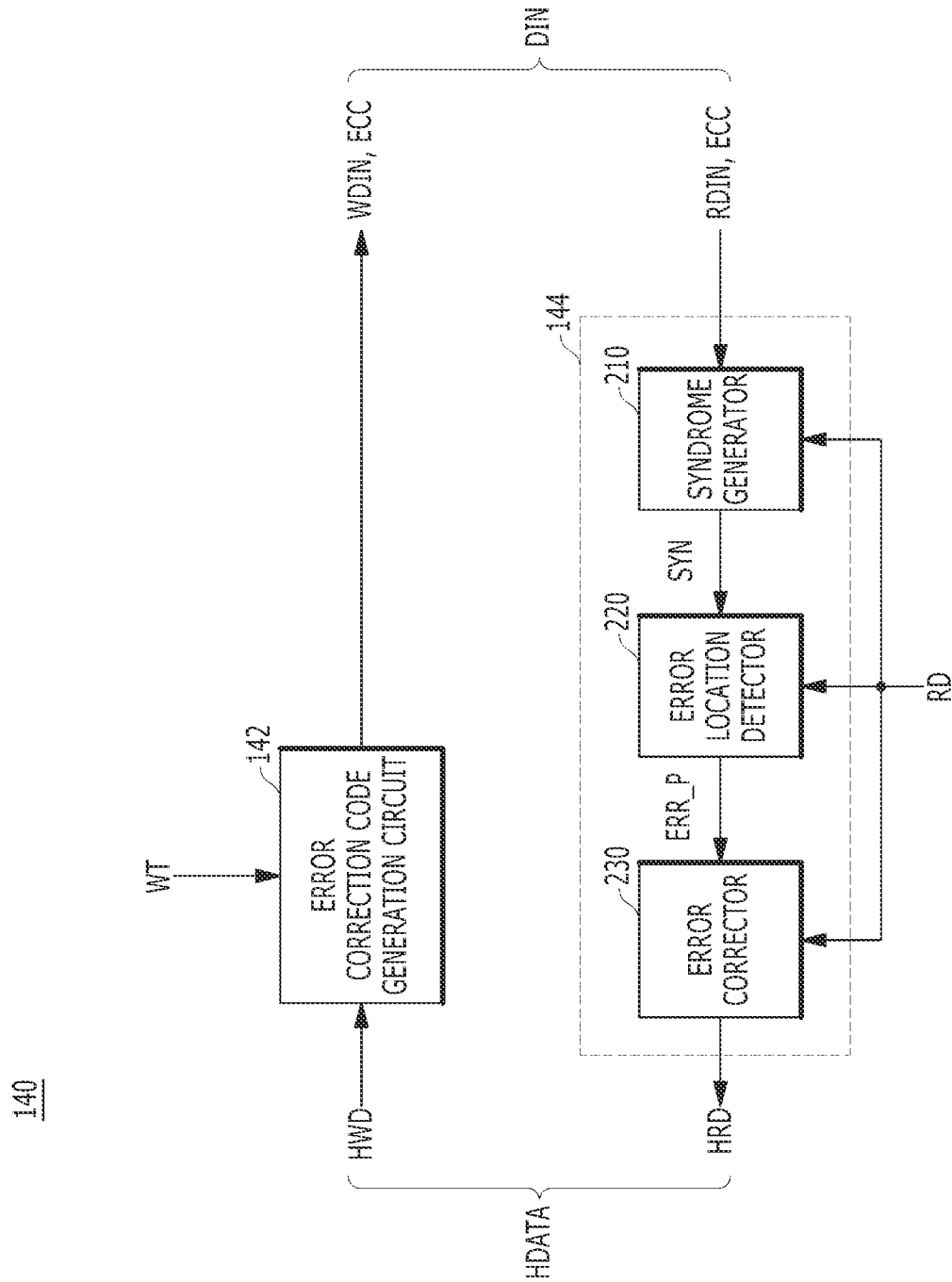
FIG. 3 is a detailed block diagram illustrating an error correction module shown in FIG. 2.

FIG. 3 is a detailed block diagram illustrating the error correction module 140 shown in FIG. 2.

Referring to FIG. 3, the error correction module 140 may include an error correction code generation circuit 142 and an error correction circuit 144.

In FIG. 3, for convenience of description, the host data HDATA is divided into host write data HWD for a write operation and host read data HRD for a read operation, and the internal data DIN is divided into internal write data WDIN for a write operation and the error correction code ECC, and internal read data RDIN for a read operation and the error correction code ECC. In this case, the internal write data WDIN and the internal read data RDIN correspond to the first to fourth internal data signals DIN1 to DIN4, and the error correction code ECC may correspond to the fifth internal data signal DIN5.

The error correction code generation circuit 142 may generate the error correction code ECC using the host write data HWD in response to the write command WT and output the internal write data WDIN and the error correction code ECC. The host write data HWD may be the same as the internal write data WDIN, since only the error correction code ECC is generated during the write operation without performing an error correction operation.

The error correction circuit 144 may correct errors in the internal read data RDIN using the error correction code ECC in response to the read command RD and output the error-corrected data as the host read data HRD.

In detail, the error correction circuit 144 may include a syndrome generator 210, an error location detector 220, and an error corrector 230, which operate according to the read command RD.

The syndrome generator 210 may generate a preliminary error correction code using the internal read data RDIN, and may generate syndrome data SYN, as encoding error location information, by bitwise comparing the preliminary error correction code with the error correction code ECC.

The error location detector 220 may detect the error locations in the internal read data RDIN and/or the error correction code ECC based on the syndrome data SYN. The error location detector 220 may decode the syndrome data SYN to generate the error location information ERR_P for the internal read data RDIN and/or the error correction code ECC. For example, the error location information ERR_P may include bits equal to the number of bits in the internal read data RDIN and/or the error correction code ECC, indicating which bits in the internal read data RDIN and/or the error correction code ECC are in error.

The error corrector 230 may correct errors in the internal read data RDIN and/or the error correction code ECC based on the error location information ERR_P to output the error-corrected data as the host read data HRD. For example, the error corrector 230 may include a plurality of XOR gates that perform a logic XOR operation on bits of the error location information ERR_P and bits of the internal read data RDIN and/or the error correction code ECC.

Figure 4:
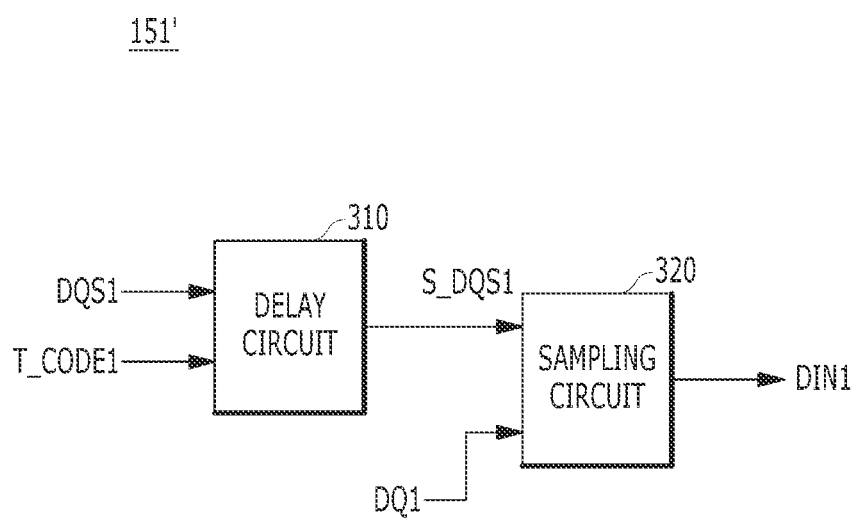
FIG. 4 is a detailed circuit diagram illustrating any one of data I/O circuits shown in FIG. 2.

FIG. 4 is a detailed circuit diagram illustrating the first data I/O circuit 151 shown in FIG. 2. Since the first to fifth data I/O circuits 151 to 155 have substantially the same configuration, the configuration of the first data I/O circuit 151 will be described by way of example.

For reference, the first data I/O circuit 151 may include a data output circuit for a write operation (not shown) and a data input circuit 151' for a read operation, and only the data input circuit 151' for a read operation will be described herein.

Referring to FIG. 4, the data input circuit 151' may include a delay circuit 310 and a sampling circuit 320.

The delay circuit 310 may include a plurality of delay cells whose delay is adjusted according to the first time code T_CODE1. Each of the delay cells may operate according to a corresponding bit of the first time code T_CODE1. Accordingly, the delay circuit 310 may delay the first data strobe signal DQS1 by a delay value set by the first time code T_CODE1 to generate a first sampling signal S_DQS1. For example, the delay value may be sequentially decreased whenever the first time code T_CODE1 is downcounted, and the delay value may be sequentially increased whenever the first time code T_CODE1 is upcounted.

The sampling circuit 320 may sample the first data signal DQ1 input from the first memory device 211 in synchronization with the first sampling signal S_DQS1 during the read operation to generate the first internal data signal DIN1 of the internal data DIN. Although not shown, the sampling circuit 320 may operate in response to a read command RD.

Figure 5:
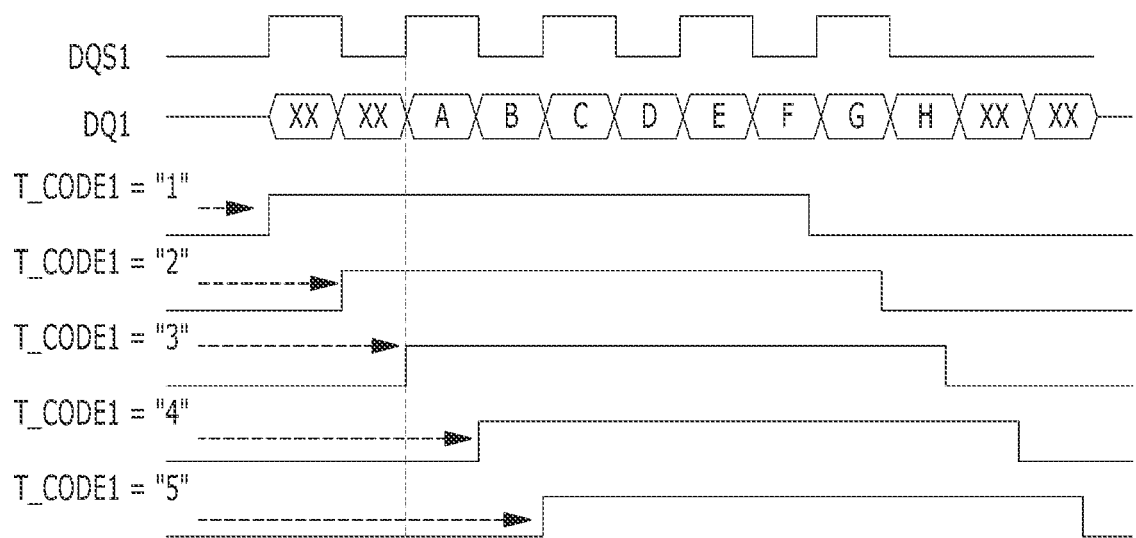
FIG. 5 is a timing diagram for explaining an operation of the data I/O circuit shown in FIG. 4.

FIG. 5 is a timing diagram for describing an operation of the first data input circuit 151' shown in FIG. 4. FIGS. 6A to 6E are tables illustrating examples of error pattern maps generated by the error pattern collection circuit 162, according to an embodiment of the present invention.

Referring to FIG. 5, the first data input circuit 151' may determine an effective window according to the delay value set by the first time code T_CODE1, and latch the first data signal DQ1 in synchronization with a rising edge and a falling edge of the first data strobe signal DQS1 within the determined effective window to generate the first internal data signal DIN1.

For example, FIG. 5 illustrates a case where the first time code T_CODE1 is set to an optimal code value of "3" by the initial training operation. The first data input circuit 151' may receive serial data in 8-bit units for each burst length BL. When the first time code T_CODE1 is set to the optimal code value of "3", the first data input circuit 151' may normally receive the first internal data signal DIN1 in the order of A-B-C-D-E-F-G-H. Accordingly, as shown in FIG. 6A, the error pattern collection circuit 162 may generate a target map for the first time code T_CODE1 having the optimal code value of "3" set by the initial training operation.

When the first time code T_CODE1 is a code value of "1", the first data input circuit 151' may abnormally receive the first internal data signal DIN1 in the order of XX-XX-A-B-C-D-E-F. Accordingly, the error correction circuit 144 may generate the error location information ERR_P for first and second burst lengths BL0 and BL1, and the error pattern collection circuit 162 may generate a first error pattern map for the first time code T_CODE1 having the code value of "1", as shown in FIG. 6B.

When the first time code T_CODE1 is a code value of "2", the first data input circuit 151' may abnormally receive the first internal data signal DIN1 in the order of XX-A-B-C-D-E-F-G. Accordingly, the error correction circuit 144 may generate the error location information ERR_P for a first burst length BL0, and the error pattern collection circuit 162 may generate a second error pattern map for the first time code T_CODE1 having the code value of "2", as shown in FIG. 6C. When the first time code T_CODE1 is a code value of "4", the first data input circuit 151' may abnormally receive the first internal data signal DIN1 in the order of B-C-D-E-F-G-H-XX. Accordingly, the error correction circuit 144 may generate the error location information ERR_P for an eighth burst length BL7, and the error pattern collection circuit 162 may generate a third error pattern map for the first time code T_CODE1 having the code value of "4", as shown in FIG. 6D.

When the first time code T_CODE1 is a code value of "5", the first data input circuit 151' may abnormally receive the first internal data signal DIN1 in the order of C-D-E-F-G-H-XX-XX. Accordingly, the error correction circuit 144 may generate the error location information ERR_P for seventh and eighth burst lengths BL6 and BL7, and the error pattern collection circuit 162 may generate a fourth error pattern map for the first time code T_CODE1 having the code value of "5", as shown in FIG. 6E.

In the same manner as described above, the error pattern collection circuit 162 may generate the error pattern maps for each time code.

Figure 7:
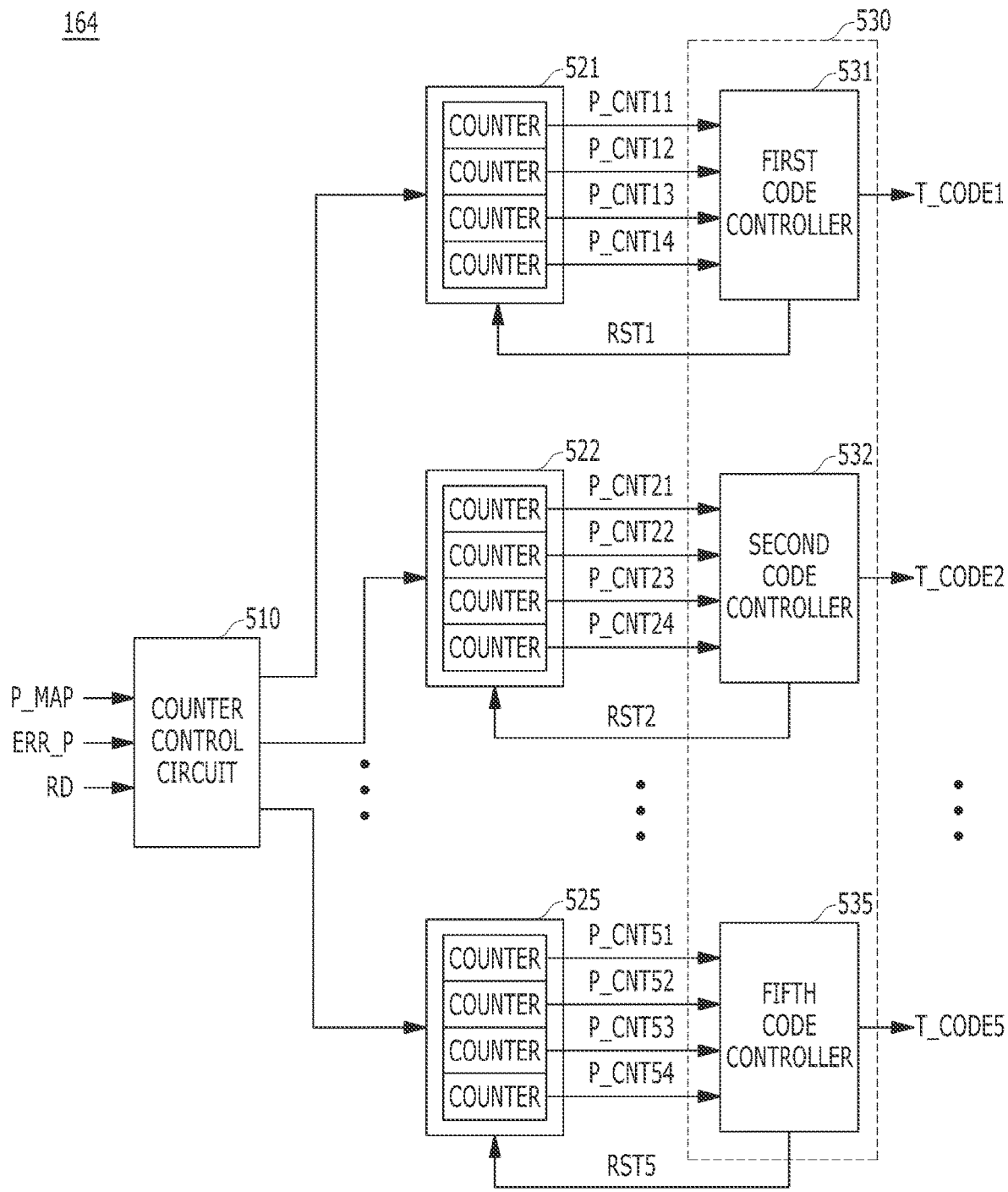
FIG. 7 is a detailed configuration diagram illustrating a time code control circuit shown in FIG. 2.

FIG. 7 is a detailed configuration diagram illustrating the time code control circuit 164 shown in FIG. 2.

Referring to FIG. 7, the time code control circuit 164 may include a counter control circuit 510, first to fifth counter groups 521 to 525, and a code control circuit 530.

The first to fifth counter groups 521 to 525 may correspond to the first to fifth memory devices 211 to 215, i.e., the first to fifth time codes T_CODE1 to T_CODE5, respectively. Each of the first to fifth counter groups 521 to 525 may have a plurality of counters corresponding to the error pattern maps. For example, if four error pattern maps are present, as described in FIGS. 6A to 6E, each of the first to fifth counter groups 521 to 525 may have four counters. The first to fifth counter groups 521 to 525 may initialize the counters in response to first to fifth initialization signals RST1 to RST5, respectively.

The counter control circuit 510 may compare the error location information ERR_P for each of the first to fifth internal data signals DIN1 to DIN5 with the error pattern maps included in the map information P_MAP, to thereby calculate a similarity therebetween, in response to the read command RD. The counter control circuit 510 may adjust counting values P_CNT11 to P_CNT54 of the first to fifth counter groups 521 to 525 by selecting an error pattern map and an internal data signal whose calculated similarity is higher than a first threshold value. For example, the first threshold may be set to a percentage between 51% and 100%.

The counter control circuit 510 may increase a counting value of a counter corresponding to the selected error pattern map among counters of a counter group corresponding to the selected internal data signal, while decreasing or maintaining counting values of the remaining counters of the same counter group. For example, if the first threshold is set to 70%, the counter control circuit 510 may calculate a similarity between the error location information ERR_P for the first internal data signal DIN1 and the first error pattern map shown in FIG. 6B, to be 75%, to select a first counter of the first counter group 521, where the first counter corresponds to the first error pattern map and the first counter group 521 corresponds to the first internal data signal DIN1. The counter control circuit 510 may increase the counting value P_CNT11 of the first counter of the first counter group 521, by "+1", while decreasing the counting values P_CNT12 to P_CNT14 of the remaining counters 522 of the first counter group 521 by "−1".

The counter control circuit 510 may decrease the counting values of all counters in a corresponding counter group when an error pattern map and an internal data signal, for which the calculated similarity is higher than the first threshold, do not exist. For example, the counter control circuit 510 may decrease the counting values P_CNT11 to P_CNT14 of all counters in the first counter group 521 by "−1" when the similarity between all error pattern maps and the error location information ERR_P for the first internal data signal DIN1 is not greater than 70%.

The code control circuit 530 may adjust the code values of the first to fifth time codes T_CODE1 to T_CODE5 according to the counting values P_CNT11 to P_CNT54 of the first to fifth counter groups 521 to 525. The code control circuit 530 may include first to fifth code controllers 531 to 535 corresponding to the first to fifth counter groups 521 to 525, respectively. Each of the first to fifth code controllers 531 to 535 may compensate a code value of a corresponding time code based on a counting value greater than a second threshold, among code values of a corresponding counter group. For example, the first code controller 531 may compensate the code value of the first time code T_CODE1 based on the second error pattern map corresponding to the second counter when the second counting value P_CNT12 is greater than the second threshold value, among the counting values P_CNT11 to P_CNT14 of the first counter group.

Meanwhile, the first to fifth code controllers 531 to 535 may generate the first to fifth initialization signals RST1 to RST5, respectively, after the code value of the corresponding time code is compensated. For example, the first code controller 531 may activate the first initialization signal RST1 after compensating the code value of the first time code T_CODE1.

Hereinafter, with reference to FIGS. 1 to 11, an operation of the memory system 10 according to an embodiment of the present invention will be described.

Figure 8:
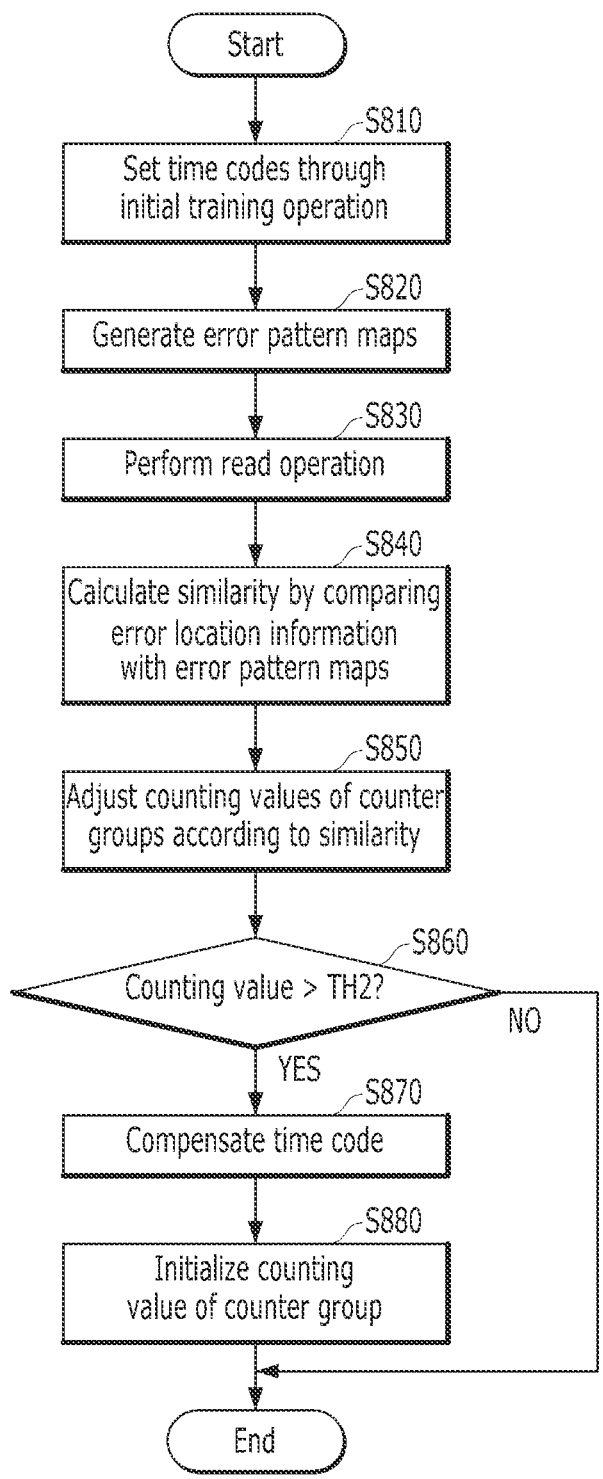
FIGS. 8 and 9 are flowcharts for describing an operating method of a memory system in accordance with an embodiment of the present invention.
Figure 9:
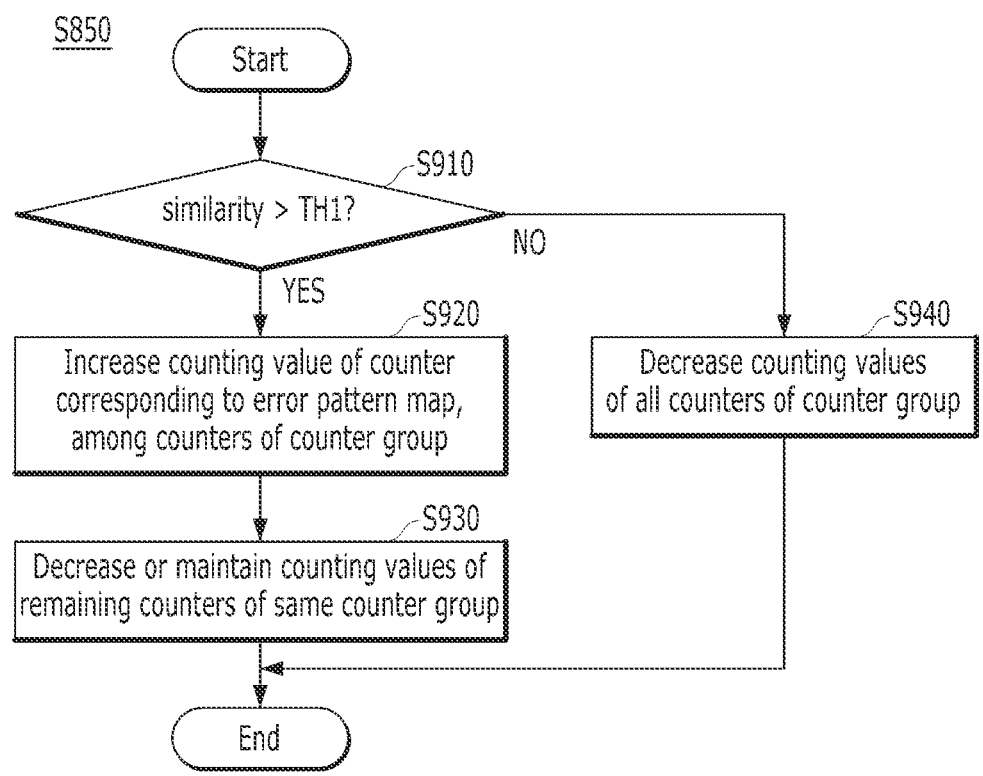

FIGS. 8 and 9 are flowcharts for describing an operating method of the memory system 10 in accordance with an embodiment of the present invention.

Referring to FIG. 8, during boot-up, the initial training circuit 161 of the training control module 160 may set the first to fifth time codes T_CODE1 to T_CODE5 through an initial training operation (at S810). The error pattern collection circuit 162 may generate the error pattern maps for each of the first to fifth time codes T_CODE1 to T_CODE5 set by the initial training circuit 161 (at S820). As described in FIGS. 6A to 6E, the error pattern collection circuit 162 may generate the error pattern maps by mapping the error location information ERR_P to each of the set time codes.

Thereafter, the first to fifth memory devices 211 to 215 may perform a read operation in response to a request REQ from the host (at S830). In the read operation, the first to fifth data I/O circuits 151 to 155 operate according to a delay value set by the first to fifth time codes T_CODE1 to T_CODE5, the first to fifth data signals DQ1 to DQ5 transmitted from the first to fifth memory devices 211 to 215 may be received as the first to fifth internal data signals DIN1 to DIN5 in synchronization with the first to fifth data strobe signals DQS1 to DQS5. The error correction circuit 144 may, in response to the read command RD, correct errors in the first to fifth internal data signals DIN1 to DIN5 to output the host data HDATA and generate the error location information ERR_P by verifying the error locations of the first to fifth internal data signals DIN1 to DIN5.

The counter control circuit 510 of the time code control circuit 164 may compare the error location information ERR_P with the error pattern maps corresponding to each of the first to fifth internal data signals DIN1 to DIN5, to thereby calculate the similarity therebetween (at S840). The counter control circuit 510 may adjust the counting values P_CNT11 to P_CNT54 of the first to fifth counter groups 521 to 525 according to the calculated similarity (at S850).

More specifically, referring to FIG. 9, the counter control circuit 510 may determine whether an error pattern map exists in which the similarity to a specific internal data signal is higher than a first threshold TH1 (at S910). When an error pattern map whose similarity to the specific internal data signal is higher than the first threshold TH1 exists ("YES" in S910), the counter control circuit 510 may increase a counting value of a counter corresponding to the error pattern map, among the counters in a counter group corresponding to the specific internal data signal (at S920), and decrease or maintain the counting values of the remaining counters in the same counter group (at S930). On the other hand, when an error pattern map whose similarity to a specific internal data signal is higher than the first threshold TH1 does not exist ("NO" in S910), the counter control circuit 510 may decrease the counting values of all counters in the corresponding counter group (at S940). Referring back to FIG. 8, each of the first to fifth code controllers 531 to 535 may determine whether a counting value greater than a second threshold TH2 exists among the counting values of the corresponding counter group (at S860).

When no counting value greater than the second threshold TH2 exists ("NO" in S860), the first to fifth code controllers 531 to 535 may terminate the operation without adjusting the time codes.

On the other hand, when a counting value greater than the second threshold TH2 exists ("YES" in S860), each of the first to fifth code controllers 531 to 535 may adjust and compensate a code value of a corresponding time code based on an error pattern map corresponding to a counter whose counting value is greater than the second threshold TH2 (at S870). Thereafter, the first to fifth code controllers 531 to 535 may generate the first to fifth initialization signals RST1 to RST5, respectively, after the code value of the corresponding time code is compensated (at S880). For example, the first code controller 531 may activate the first initialization signal RST1 after compensating the code value of the first time code T_CODE1.

Figure 10:
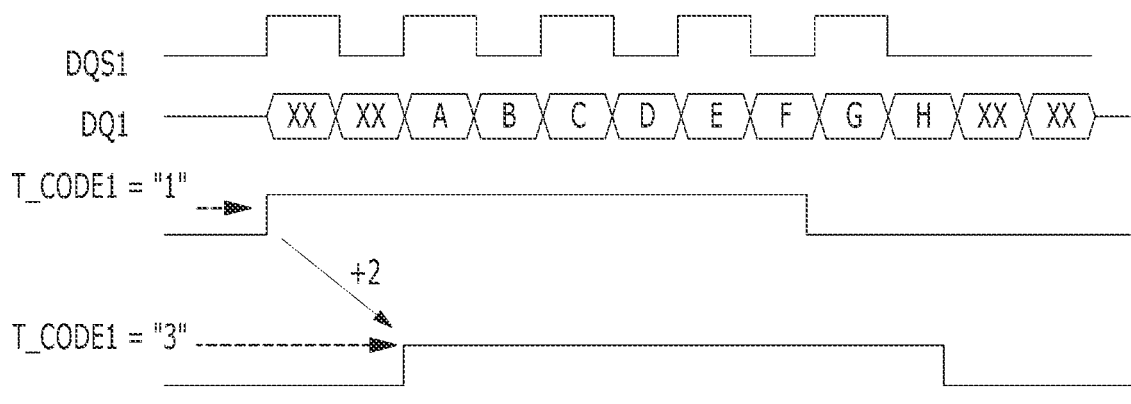
FIGS. 10 and 11 are diagrams which illustrate an operation shown in FIG. 8.
Figure 10:
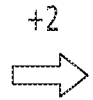
Figure 11:
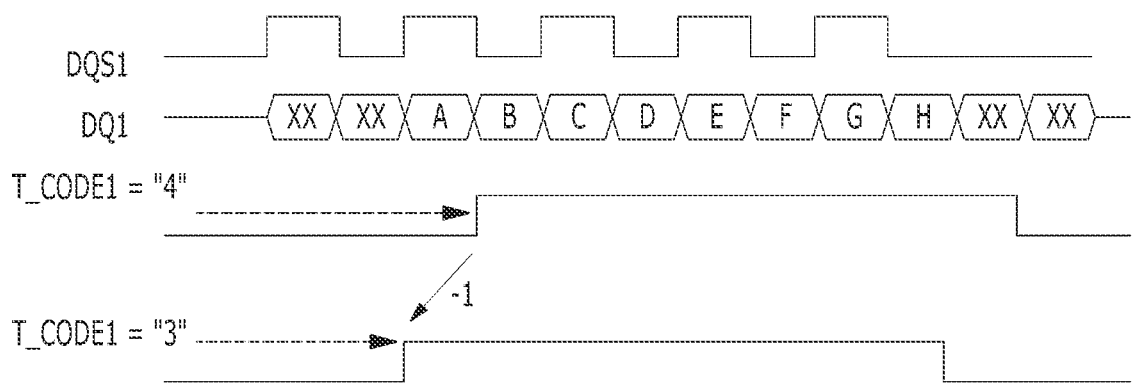
Figure 11:

FIGS. 10 and 11 are diagrams which illustrate an operation shown in FIG. 8.

Referring to FIG. 10, a case in which the first time code T_CODE1 is set to an optimum delay value of "1" through the initial training operation is illustrated. According to the delay value set by the first time code T_CODE1, the first data I/O circuit 151 has received the first data signal DQ1 transmitted from the first memory device 211 as the first internal data signal DIN1 in the order of A-B-C-D-E-F-G-H in synchronization with the first data strobe signal DQS1. However, since the data input/output timing may become skewed over time, the first data input circuit 151' may abnormally receive the first internal data signal DIN1 in the order of XX-XX-A-B-C-D-E-F.

The counter control circuit 510 may detect a first error pattern map (see FIG. 6B) whose similarity to the first internal data signal DIN1 is higher than the first threshold TH1 and increase the counting value P_CNT11 of the first counter of the first counter group, while decreasing or maintaining the counting values P_CNT12 to P_CNT14 of the remaining counters of the first counter group. In this way, after several read operations are performed, when the counting value P_CNT11 of the first counter exceeds the second threshold TH2, the first code controller 531 may compensate the code value of the first time code T_CODE1 by "+2" to an optimal delay value of "3" based on the first error pattern map corresponding to the first counter.

Referring to FIG. 11, in a case where the first time code T_CODE1 is set to an optimum delay value of "4" through the initial training operation is illustrated. However, since the data input/output timing may become skewed over time, the first data input circuit 151' may abnormally receive the first internal data signal DIN1 in the order of B-C-D-E-F-G-H-XX.

The counter control circuit 510 may detect a third error pattern map (see FIG. 6D) whose similarity to the first internal data signal DIN1 is higher than the first threshold TH1 and increase the counting value P_CNT13 of the third counter of the first counter group, while decreasing or maintaining the counting values P_CNT11, P_CNT12 and P_CNT14 of the remaining counters of the first counter group. When the counting value P_CNT13 of the third counter exceeds the second threshold TH2, the first code controller 531 may compensate the code value of the first time code T_CODE1 by "−1" to an optimal delay value of "3" based on the third error pattern map corresponding to the third counter.

In the above embodiment, a case in which the first to fifth time codes T_CODE1 to T_CODE5 are each set to an absolute value is described as an example, but the present invention is not limited thereto. In an embodiment, the time code (e.g., the first time code T_CODE1) having the optimal code value among the first to fifth time codes T_CODE1 to T_CODE5 may be set to a reference value of "0", and the remaining time codes may be set to relative values (e.g., "−2", "−1", "+1", "+2") to the reference value. For example, in FIG. 11, the first code controller 531 may compensate for the code value (e.g., "+1") of the first time code T_CODE1 to an optimal delay value of "0" by adjusting the code value by "−1".

As described above, in accordance with the embodiment, the memory system may perform the training operation in real time during the read operation, so that the data input/output timing may be optimized without performance degradation even if the data input/output timing is changed after the initial training operation.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory system comprising:
a plurality of memory devices; and
a memory controller configured to
perform an initial training operation to set a plurality of time codes corresponding to the plurality of memory devices, respectively,
receive a plurality of data signals read from the plurality of memory devices, as internal data signals, according to the plurality of time codes, respectively, and
adjust the plurality of time codes based on the internal data signals and error pattern maps generated by collecting error location information for the internal data signals.

2. The memory system of claim 1, wherein the memory controller is configured to:
generate, during boot-up, the error pattern maps for each of the plurality of time codes by collecting the error location information on each of the internal data signals; and
compare, during a read operation, the error location information with the error pattern maps to calculate a similarity therebetween, and adjust the plurality of time codes according to the calculated similarity.

3. The memory system of claim 2,
wherein the memory controller includes counter groups corresponding to the plurality of time codes, and
wherein the memory controller is configured to:
adjust counting values of the counter groups by selecting an error pattern map and an internal data signal whose calculated similarity is higher than a first threshold value; and adjust the plurality of time codes, respectively, depending on the counting values of the counter groups.

4. The memory system of claim 3, wherein each of the counter groups includes a plurality of counters corresponding to the error pattern maps.

5. The memory system of claim 4, wherein the memory controller is configured to:
increase a counting value of a counter corresponding to the selected error pattern map, among counters of a counter group corresponding to the selected internal data signal; and
decrease or maintain counting values of the remaining counters of the counter group.

6. The memory system of claim 4, wherein the memory controller is configured to decrease counting values of all counters in a corresponding counter group when an error pattern map and an internal data signal, whose calculated similarity is higher than the first threshold, do not exist.

7. The memory system of claim 3,
wherein the memory controller further includes a plurality of code controllers respectively corresponding to the counter groups, and
wherein each of the code controllers is configured to compensate a code value of a corresponding time code based on a counting value greater than a second threshold, among code values of a corresponding counter group.

8. The memory system of claim 7, wherein the code controllers are configured to generate a plurality of initialization signals for respectively initializing the counting values of the counter groups after the code value of the corresponding time code is compensated.

9. The memory system of claim 1, wherein the memory controller is configured to:
generate the error location information by verifying error locations of the internal data signals; and receive the data signals from the plurality of memory devices, as the internal data signals, according to delay values set by the plurality of time codes.

10. A controller comprising:
an error correction module configured to generate error location information by verifying error locations of internal data signals;
a training control module configured to generate a plurality of error pattern maps by collecting the error location information for the internal data signals, and adjust a plurality of time codes based on the internal data signals and the error pattern maps; and
a memory interface configured to receive data signals from a plurality of memory devices, as the internal data signals, according to delay values set by the plurality of time codes.

11. The controller of claim 10, wherein the training control module includes:
an initial training circuit configured to perform an initial training operation during boot-up to set the plurality of time codes;
an error pattern collection circuit configured to generate, during the boot-up, the error pattern maps by collecting the error location information; and
a time code control circuit configured to compare, during a read operation, the error location information with the error pattern maps to calculate a similarity therebetween, and adjust the plurality of time codes according to the calculated similarity.

12. The controller of claim 11, wherein the time code control circuit includes:
a plurality of counter groups corresponding to the plurality of time codes;
a counter control circuit configured to adjust counting values of the counter groups by selecting an error pattern map and an internal data signal whose calculated similarity is higher than a first threshold value; and
a code control circuit configured to adjust the plurality of time codes, respectively, according to the counting values of the counter groups.

13. The controller of claim 12,
wherein each of the counter groups includes a plurality of counters corresponding to the error pattern maps, and
wherein the counter control circuit is configured to:
increase a counting value of a counter corresponding to the selected error pattern map, among counters of a counter group corresponding to the selected internal data signal; and
decrease or maintain counting values of the remaining counters of the counter group.

14. The controller of claim 13,
wherein the counter control circuit is configured to decrease counting values of all counters in a corresponding counter group when an error pattern map and an internal data signal, whose calculated similarity is higher than the first threshold, do not exist.

15. The controller of claim 12,
wherein the code control circuit includes a plurality of code controllers respectively corresponding to the counter groups, and
wherein each of the code controllers is configured to compensate a code value of a corresponding time code based on a counting value greater than a second threshold, among code values of a corresponding counter group.

16. The controller of claim 15, wherein the code controllers are configured to generate a plurality of initialization signals for respectively initializing the counting values of the counter groups after the code value of the corresponding time code is compensated.

17. The controller of claim 10,
wherein the memory interface includes a plurality of data input/output (I/O) circuits configured to transmit and receive the data signals to and from to the plurality of memory devices, and
wherein each of the data I/O circuits includes:
a delay circuit configured to generate a sampling signal by delaying a corresponding data strobe signal by a delay value set by a corresponding time code; and
a sampling circuit configured to sample a corresponding data signal in synchronization with the sampling signal to generate a corresponding internal data signal.

18. An operating method of a memory system, the operating method comprising:
performing an initial training operation to set a plurality of time codes corresponding to the plurality of memory devices, respectively;
receiving a plurality of data signals read from the plurality of memory devices, as internal data signals, according to the plurality of time codes, respectively, during a read operation;
calculating a similarity by comparing error location information corresponding to each of the internal data signals with error pattern maps; and
adjusting the plurality of time codes according to the calculated similarity.

19. The operating method of claim 18, further comprising:
receiving, during the boot-up, the data signals as the internal data signals according to the plurality of time codes; and
generating, during the boot-up, the error pattern maps for each of the plurality of time codes by collecting the error location information on each of the internal data signals.

20. The operating method of claim 18, wherein the adjusting the plurality of time codes includes:
adjusting counting values of counter groups corresponding to the plurality of time codes, by selecting an error pattern map and an internal data signal whose calculated similarity is higher than a first threshold value; and
compensating code values of the plurality of time codes based on a counting value greater than a second threshold, among code values of the counter groups.

21. The operating method of claim 20, further comprising:
respectively initializing the counting values of the counter groups after the code values of the plurality of time codes are compensated.

22. The operating method of claim 20, wherein the adjusting counting values of counter groups includes:
increasing a counting value of a counter corresponding to the selected error pattern map, among counters of a counter group corresponding to the selected internal data signal; and
decreasing or maintaining counting values of the remaining counters of the counter group.

23. The operating method of claim 20, wherein the adjusting counting values of counter groups includes decreasing counting values of all counters in a corresponding counter group when an error pattern map and an internal data signal, whose calculated similarity is higher than the first threshold do not exist.

* * * * *